United States Patent
Park

[11] Patent Number: 6,146,459
[45] Date of Patent: Nov. 14, 2000

[54] CZOCHRALSKI PULLERS FOR MANUFACTURING MONOCRYSTALLINE SILICON INGOTS BY CONTROLLING TEMPERATURE AT THE CENTER AND EDGE OF AN INGOT-MELT INTERFACE

[75] Inventor: Jae-gun Park, Kyungki-do, Rep. of Korea

[73] Assignee: Samsung Electronics Co., Ltd., Rep. of Korea

[21] Appl. No.: 09/320,102

[22] Filed: May 26, 1999

Related U.S. Application Data

[63] Continuation-in-part of application No. 08/989,591, Dec. 12, 1997.
[60] Provisional application No. 60/063,086, Oct. 24, 1997.

[30] Foreign Application Priority Data

Feb. 13, 1997 [KR] Rep. of Korea .......... 97-4291
Oct. 24, 1997 [KR] Rep. of Korea .......... 97-54899

[51] Int. Cl.[7] .................................................. C30B 35/00
[52] U.S. Cl. ..................... 117/217; 117/218; 117/222; 117/900
[58] Field of Search ................................ 117/208, 217, 117/218, 222, 900

[56] References Cited

U.S. PATENT DOCUMENTS

| 3,951,729 | 4/1976 | Takagi et al. ............ 156/617 |
| 5,248,378 | 9/1993 | Oda et al. ............... 156/617.1 |
| 5,485,803 | 1/1996 | Habu ......................... 117/14 |
| 5,779,791 | 7/1998 | Korb et al. ................ 117/15 |
| 5,972,106 | 10/1999 | Ohta et al. ............... 117/13 |

FOREIGN PATENT DOCUMENTS

| 0 444 628 A1 | 9/1991 | European Pat. Off. . |
| 0 482 438 A1 | 4/1992 | European Pat. Off. . |
| 0 529 571 A1 | 3/1993 | European Pat. Off. . |
| 0 536 405 A1 | 4/1993 | European Pat. Off. . |
| 8-330316 | 12/1996 | Japan . |

OTHER PUBLICATIONS

Park et al., *Effect of Crystal Defects on Device Characteristics*, Proceeding of $2^{nd}$ International Symposium on Advanced Science and Technology Si Material, Kona Hawaii, Nov. 25–29, 1996.

Voronkov, *The Mechanism of Swirl Defects Formation in Silicon*, Journal of Crystal Growth, V. 59, 1982, pp. 625–643.

*Primary Examiner*—Felisa Hiteshew
*Attorney, Agent, or Firm*—Myers Bigel Sibley & Sajovec

[57] ABSTRACT

Czochralski pullers are modified to grow perfect monocrystalline silicon ingots that are free of vacancy agglomerates and interstitial agglomerates, by modifying components of the Czochralski puller to produce a temperature gradient at the ingot-melt interface that is greater than about 2.5 degrees Kelvin per millimeter at the ingot axis and is also at least about equal to the temperature gradient at a diffusion length from the cylindrical edge of the ingot. By producing a temperature gradient at the ingot-melt interface that is greater than about 2.5 degrees Kelvin per millimeter at the ingot axis and that is also at least about equal to the temperature gradient at a diffusion length from the diffusion edge, an ingot-melt interface that is planar or is convex relative to the silicon melt may be produced. The ingot so pulled is sliced into a plurality of pure silicon wafers that may include point defects but that are free of vacancy agglomerates and interstitial agglomerates.

21 Claims, 12 Drawing Sheets

CZOCHRALSKI PULLERS FOR MANUFACTURING MONOCRYSTALLINE SILICON INGOTS BY CONTROLLING TEMPERATURE AT THE CENTER AND EDGE OF AN INGOT-MELT INTERFACE

RELATED APPLICATIONS

This application is a continuation-in-part of U.S. application Ser. No. 08/989,591 entitled "Methods of Manufacturing Monocrystalline Silicon Ingots and Wafers by Controlling Pull Rate Profiles in a Hot Zone Furnace, and Ingots and Wafers Manufactured Thereby", filed on Dec. 12, 1997, which itself claims the benefit of U.S. Provisional Application No. 60/063,086, entitled "*Methods of Forming Semiconductor Ingots and Ingots and Wafers Formed Therefrom*", filed on Oct. 24, 1997, Korean Application No. 97-4291, filed Feb. 13, 1997, and Korean Application No. 97-54899, filed on Oct. 24, 1997, the disclosures of all of which are hereby incorporated herein in their entirety be reference.

FIELD OF THE INVENTION

This invention relates to microelectronic manufacturing methods and devices, and more particularly to silicon ingot manufacturing methods and silicon ingots and wafers manufactured thereby.

BACKGROUND OF THE INVENTION

Integrated circuits are widely used in consumer and commercial applications. Integrated circuits are generally fabricated from monocrystalline silicon. As the integration density of integrated circuits continues to increase, it generally is of increasing importance to provide high-quality monocrystalline semiconductor material for integrated circuits. Integrated circuits are typically produced by fabricating a large ingot of monocrystalline silicon, slicing the ingot into wafers, performing numerous microelectronic fabrication processes on the wafers and then dicing the wafers into individual integrated circuits that are packaged. Because the purity and crystallinity of the silicon ingot can have a large impact on the performance of the ultimate integrated circuit devices that are fabricated therefrom, increased efforts have been made to fabricate ingots and wafers with reduced numbers of defects.

Conventional methods of manufacturing monocrystalline silicon ingots will now be described. An overview of these methods is provided in Chapter 1 of the textbook "Silicon Processing for the VLSI Era, Volume 1, Process Technology", by Wolf and Tauber, 1986, pp. 1–35, the disclosure of which is hereby incorporated herein by reference. In manufacturing monocrystalline silicon, electronic grade polysilicon is converted into a monocrystalline silicon ingot. Polycrystalline silicon such as quartzite is refined to produce electronic grade polycrystalline silicon. The refined electronic grade polycrystalline silicon is then grown into a single crystal ingot using the Czochralski (CZ) or Float Zone (FZ) technique. Since the present invention relates to manufacturing a silicon ingot using the CZ technique, this technique will now be described.

Czochralski growth involves crystalline solidification of atoms from a liquid phase at an interface. In particular, a crucible is loaded with a charge of electronic grade polycrystalline silicon and the charge is melted. A seed crystal of silicon of precise orientation tolerances is lowered into the silicon melt. The seed crystal is then withdrawn at a controlled rate in the axial direction. Both the seed crystal and the crucible are generally rotated during the pulling process, in opposite directions.

The initial pull rate is generally relatively rapid so that a thin neck of silicon is produced. Then, the melt temperature is reduced and stabilized so that the desired ingot diameter can be formed. This diameter is generally maintained by controlling the pull rate. The pulling continues until the melt is nearly exhausted, at which time a tail is formed.

FIG. 1 is a schematic diagram of a Czochralski puller. As shown in FIG. 1, the Czochralski puller 100 includes a furnace, a crystal pulling mechanism, an environment controller and a computer-based control system. The Czochralski furnace is generally referred to as a hot zone furnace. The hot zone furnace includes a heater 104, a crucible 106 which may be made of quartz, a succeptor 108 which may be made of graphite and a rotation shaft 110 that rotates about an axis in a first direction 112 as shown.

A cooling jacket or port 132 is cooled by external cooling means such as water cooling. A heat shield 114 may provide additional thermal distribution. A heat pack 102 is filled with heat absorbing material 116 to provide additional thermal distribution.

The crystal pulling mechanism includes a crystal pulling shaft 120 which may rotate about the axis in a direction 122 opposite the direction 112 as shown. The crystal pulling shaft 120 includes a seed holder 120a at the end thereof. The seed holder 120a holds a seed crystal 124, which is pulled from the melt 126 in the crucible 106 to form an ingot 128.

The ambient control system may include the chamber enclosure 130, the cooling jacket 132 and other flow controllers and vacuum exhaust systems that are not shown. A computer-based control system may be used to control the heating elements, puller and other electrical and mechanical elements.

In order to grow a monocrystalline silicon ingot, the seed crystal 124 is contacted to the silicon melt 126 and is gradually pulled in the axial direction (up). Cooling and solidification of the silicon melt 126 into monocrystalline silicon occurs at the interface 130 between the ingot 128 and the melt 126. As shown in FIG. 1, the interface 130 is concave relative to the melt 126.

Real silicon ingots differ from ideal monocrystalline ingots because they include imperfections or defects. These defects are undesirable in fabricating integrated circuit devices. These defects may be generally classified as point defects or agglomerates (three-dimensional defects). Point defects are of two general types: vacancy point defects and interstitial point defects. In a vacancy point defect, a silicon atom is missing from one of its normal positions in the silicon crystal lattice. This vacancy gives rise to a vacancy point defect. On the other hand, if an atom is found at a non-lattice site (interstitial site) in the silicon crystal, it gives rise to an interstitial point defect.

Point defects are generally formed at the interface 130 between the silicon melt 126 and the solid silicon 128. However, as the ingot 128 continues to be pulled, the portion that was at the interface begins to cool. During cooling, diffusion of vacancy point defects and interstitial point defects may cause defects to coalesce and form vacancy agglomerates or interstitial agglomerates. Agglomerates are three-dimensional (large) structures that arise due to coalescence of point defects. Interstitial agglomerates are also referred to as dislocation defects or D-defects. Agglomerates are also sometimes named by the technique that is used to detect these defects. Thus, vacancy agglomerates are sometimes referred to as Crystal-Originated Particles (COP), Laser Scattering Tomography (LST) defects or Flow Pattern Defects (FPD). Interstitial agglomerates are also known as Large Dislocation (L/D) agglomerates. A discussion of defects in monocrystalline silicon is provided in Chapter 2 of the above-mentioned textbook by Wolf and Tauber, the disclosure of which is hereby incorporated herein by reference.

It is known that many parameters may need to be controlled in order to grow a high purity ingot having low numbers of defects. For example, it is known to control the pull rate of the seed crystal and the temperature gradients in the hot zone structure. Voronkov's Theory found that the ratio of V to G (referred to as V/G) can determine the point defect concentration in the ingot, where V is the pull rate of the ingot and G is the temperature gradient of the ingot-melt interface. Voronkov's Theory is described in detail in "*The Mechanism of Swirl Defects Formation in Silicon*" by Voronkov, Journal of Crystal Growth, Vol. 59, 1982, pp. 625–643.

An application of Voronkov's Theory may be found in a publication by the present inventor et al. entitled "*Effect of Crystal Defects on Device Characteristics*", Proceedings of the Second International Symposium on Advanced Science and Technology of Silicon Material, Nov. 25–29, 1996, p. 519. At FIG. 15, reproduced herein as FIG. 2, a graphical illustration of vacancy and interstitial concentrations, as a function of V/G, is shown. Voronkov's Theory shows that the generation of a vacancy/interstitial mixture in a wafer is determined by V/G. More particularly, for V/G ratios below a critical ratio, an interstitial rich ingot is formed, while for V/G ratios above the critical ratio, a vacancy rich ingot is formed.

Notwithstanding many theoretical investigations by physicists, material scientists and others, and many practical investigations by Czochralski puller manufacturers, there continues to be a need to reduce the defect density in monocrystalline silicon wafers. The ultimate need is for pure silicon wafers that are free of vacancy and interstitial agglomerates.

SUMMARY OF THE INVENTION

The present invention provides methods for modifying Czochralski pullers and Czochralski pullers so modified, to grow perfect monocrystalline silicon ingots that are free of vacancy agglomerates and interstitial agglomerates, by modifying components of the Czochralski puller to produce a temperature gradient at the ingot-melt interface that is greater than about 2.5 degrees Kelvin per millimeter at the ingot axis and is also at least about equal to the temperature gradient at a diffusion length from the cylindrical edge of the ingot. By producing a temperature gradient at the ingot-melt interface that is greater than about 2.5 degrees Kelvin per millimeter at the ingot axis and that is also at least about equal to the temperature gradient at a diffusion length from the diffusion edge, an ingot-melt interface that is planar or is convex relative to the silicon melt may be produced. The ingot so pulled is sliced into a plurality of pure silicon wafers that may include point defects but that are free of vacancy agglomerates and interstitial agglomerates.

Czochralski pullers according to the present invention include an enclosure and a crucible in the enclosure that holds a silicon melt. A seed holder is provided in the enclosure, adjacent the crucible. A heater is provided in the enclosure, surrounding the crucible. A heat pack is provided in the enclosure, surrounding the heater. A heat shield is provided between the crucible and the seed holder and a cooling jacket is provided between the heat shield and the seed holder. Means are provided for pulling the seed holder away from the crucible to thereby pull a monocrystalline silicon ingot from the silicon melt. The monocrystalline silicon ingot has an axis and a cylindrical edge. The silicon melt and the ingot define an ingot-melt interface therebetween.

According to the invention, at least one of the position of the heat shield, the configuration of the heat shield, the position of the heater, the configuration of the cooling jacket, the position of the crucible, the configuration of the heat pack and the power that is applied to the heater are selected to produce a temperature gradient at the ingot-melt interface that is greater than about 2.5 degrees Kelvin per millimeter at the axis and that is also at least about equal to the temperature gradient at a diffusion length from the cylindrical edge of the ingot. According to another aspect of the invention, at least one of the position of the heat shield, the configuration of the heat shield, the position of the heater, the configuration of the cooling jacket, the position of the crucible, the configuration of the heat pack and the power that is applied to the heater are selected to produce an ingot-melt interface that is planar or is convex relative to the silicon melt.

Each of the above described parameters may be varied separately. For example, the crucible includes a crucible top and a crucible bottom and the heat shield includes a heat shield top and a heat shield bottom. The position of the heat shield preferably is selected by varying the distance between the heat shield bottom and the crucible top.

The configuration of the heat shield may be selected by providing a heat shield cover at the heat shield bottom. The heat shield cover preferably comprises a ring-shaped heat shield housing within the crucible, including inner and outer heat shield housing walls, an oblique heat shield housing floor and a heat shield housing roof that extend between the inner and outer heat shield housing walls. The heat shield housing preferably contains insulating material therein. The oblique heat shield housing defines an angle from horizontal and the configuration of the heat shield preferably is also selected by varying this angle.

The heater also includes a heater top and a heater bottom, and the position of the heater preferably is selected by varying the distance between the crucible top and the heater top. The position of the heater and the position of the crucible also may be concurrently varied axially relative to the enclosure.

The cooling jacket also includes a cooling jacket top and a cooling jacket bottom and the position of the cooling jacket preferably is selected by varying the distance between the crucible top and the cooling jacket bottom. The heat pack includes an upper heat pack housing and a lower heat pack housing, each of which is filled with heat absorbing material. The configuration of the heat pack preferably is selected by removing at least some of the heat absorbing material from the upper heat pack housing.

The above described parameters are preferably varied together to produce a temperature gradient of the ingot-melt interface that is greater than about 2.5 degrees Kelvin per millimeter at the axis and that is also at least about equal to the temperature gradient at a diffusion length from the cylindrical edge of the ingot. More specifically, at least one of the position of the heat shield, the configuration of the heat shield and the position of the heater are selected to produce a temperature gradient at the ingot-melt interface at the axis that is at least about equal to the temperature gradient at a diffusion length from the cylindrical edge. Then, at least one of the configuration of the cooling jacket, the position of the crucible and the configuration of the heat pack are selected to produce a temperature gradient at the ingot-melt interface at the axis that is greater than about 2.5 degrees Kelvin per millimeter.

More preferably, the position of the heat shield, the configuration of the heat shield and the position of the heater are all selected to produce a temperature gradient at the ingot-melt interface at the axis that is greater than the temperature gradient at the cylindrical edge. Then, the configuration of the cooling jacket, the position of the crucible, the position of both the heater and the crucible and the configuration of the heat pack are all selected to produce a temperature gradient at the ingot-melt interface axis that is greater than about 2.5 degrees Kelvin per millimeter while maintaining the temperature gradient at the axis to be at least about equal to the temperature gradient at a diffusion length from the cylindrical edge. Perfect silicon wafers can thereby be formed in modified Czochralski pullers.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Overview: Vacancy Rich and Perfect Wafers

Figure 1:
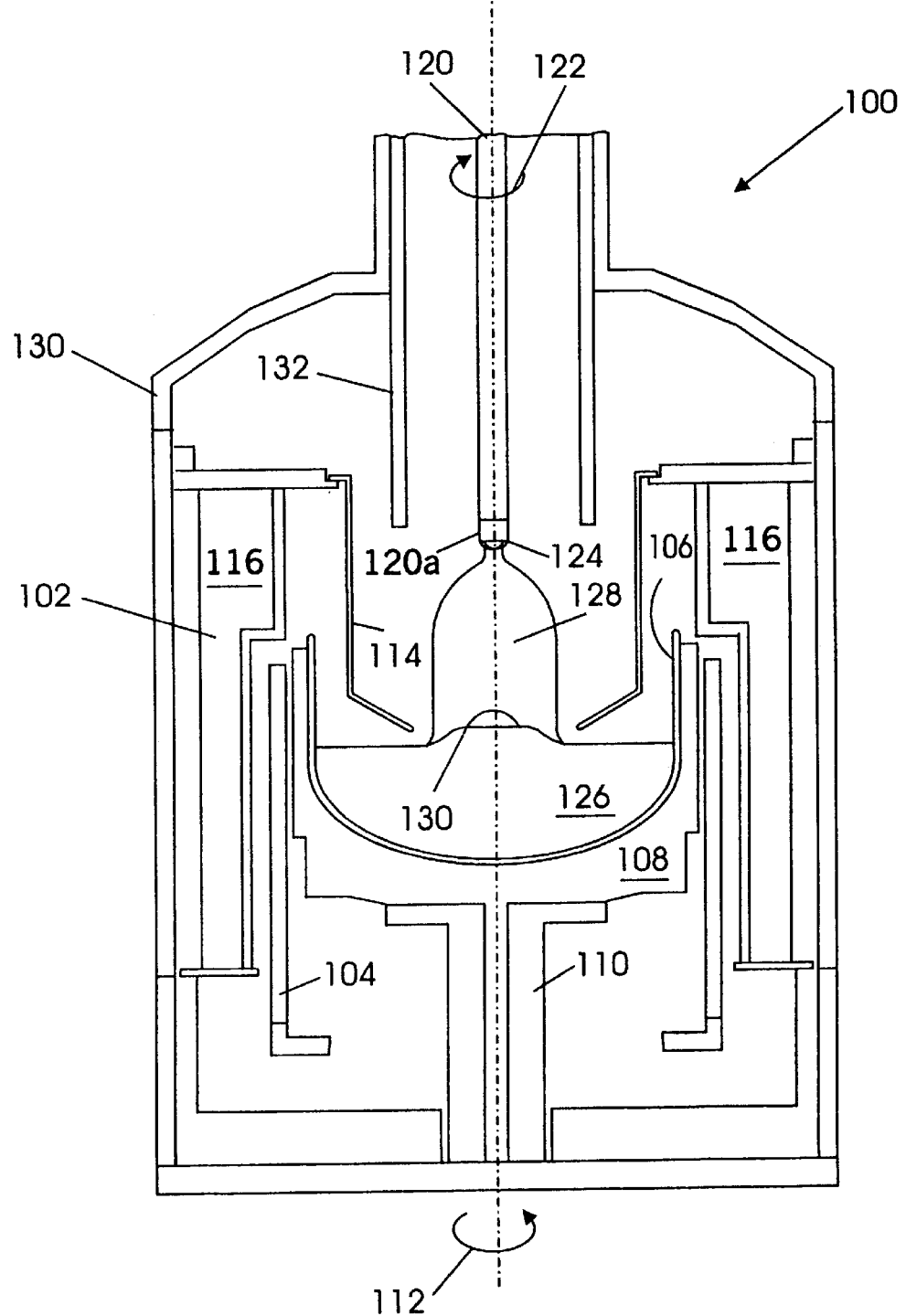
FIG. 1 is a schematic representation of a Czochralski puller for growing monocrystalline silicon ingots.
Figure 2:
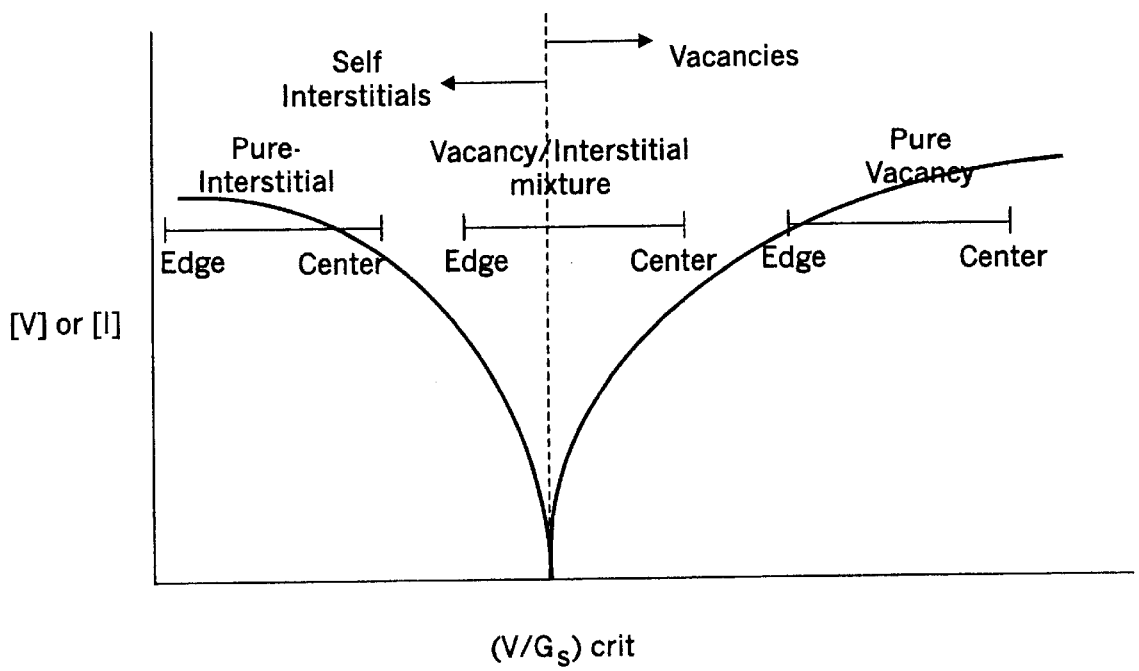
FIG. 2 graphically illustrates Vronokov's Theory.
Figure 3A:
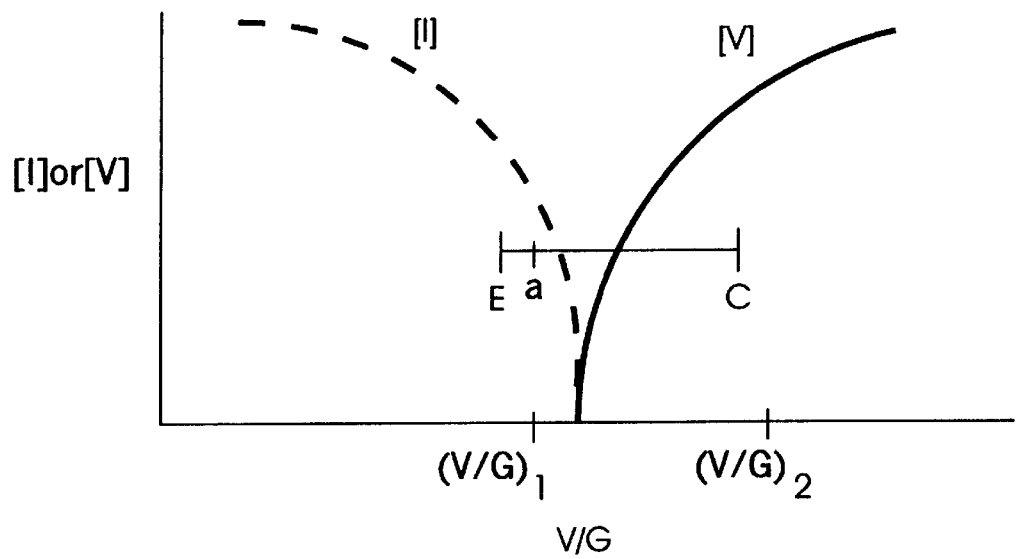
FIGS. 3A–3E illustrate an overview of the fabrication of wafers having a vacancy rich region at the center thereof and a pure region between the vacancy rich region and the wafer edge.

Referring now to FIGS. 3A–3E, an overview of the fabrication of semi-pure wafers having (1) a vacancy rich region at the center thereof that may include vacancy agglomerates and (2) a pure region between the vacancy rich region and the wafer edge that is free of vacancy agglomerates and interstitial agglomerates, according to application Ser. No. 08/989,591, will now be described. As shown in FIG. 3A, the fabrication of these vacancy rich wafers can begin with an overview of Voronkov's Theory. Voronkov's Theory is graphically illustrated in FIG. 3A. As shown by the line beginning from the edge (E) and ending at the center (C), it has been found according to the invention of application Ser. No. 08/989,591 that if the ratio of pull rate to temperature gradient at the ingot melt surface, referred to as V/G, is maintained greater than $(V/G)_1$ at a diffusion length from the edge E, identified by point a, and less than $(V/G)_2$ at the center C, then semi-pure wafers having a vacancy rich region at the center thereof and a pure region between the vacancy rich region and the wafer edge may be fabricated. In particular, V/G will vary radially across a wafer in an ingot, and generally will decrease from the wafer center to the wafer edge due to the differing thermal characteristics at the center and edge of the wafer. Thus, a given wafer experiences a radial V/G range as shown in FIG. 3A from the center (C) to the edge (E) thereof.

A critical concern in the fabrication of silicon ingots and wafers is the formation of agglomerates, either vacancy or interstitial, in the wafer. It is known that agglomerates are formed due to coalescence of point defects that are formed during the initial fabrication of the ingot from the melt. The point defect concentration is generally determined by conditions at the interface between the silicon ingot and the silicon melt. Then, as the ingot is pulled further, diffusion and cooling determines the coalescence of point defects to form agglomerates.

Figure 3B:
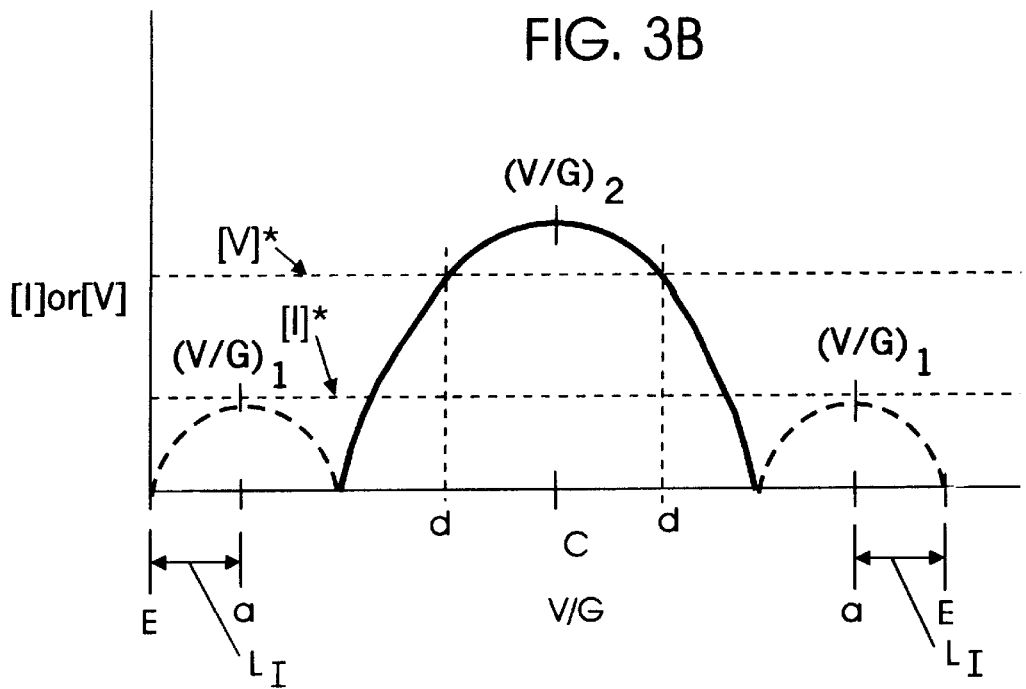

As shown in FIG. 3B, it has been found, according to the invention of application Ser. No. 08/989,591, that a critical vacancy point defect concentration $[V]^*$ and a critical interstitial point defect concentration $[I]^*$ exist, below which point defects will not coalesce into agglomerates. It has been found according to the present invention that if the concentration of point defects is maintained below these critical concentrations in the peripheral area of the wafer, then a vacancy rich region is formed at the center of the wafer, but a pure region is formed between the vacancy rich region and the wafer edge.

Figure 3C:
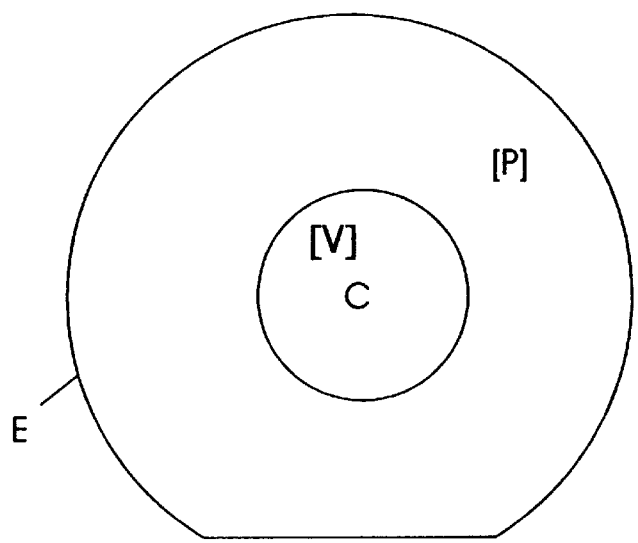

Thus, as shown in FIG. 3B, the vacancy concentration is maintained below the critical vacancy concentration $[V]^*$ across the wafer except near the center C thereof. As shown in FIG. 3C, a vacancy rich region [V] is formed at the center thereof, but the area outside the vacancy rich region [V] to the wafer edge, is free of vacancy agglomerates and is therefore designated [P] (pure or perfect).

Referring again to FIG. 3B, for interstitials, the interstitial concentration is maintained below the critical interstitial concentration [I]* from the center C of the wafer until a diffusion length $L_f$ from the edge E of the wafer corresponding to point a. Between the diffusion length $L_f$ of the wafer and the edge E, even if the interstitial concentration is initially above the critical concentration [I]* at the ingot-melt interface, diffusion will allow the interstitial vacancies to diffuse out of the ingot and not form agglomerates during the crystal growth. The diffusion length $L_f$ is generally between about 2.5 and 3 cm for 8 inch wafers. Accordingly, as shown in FIG. 3C, a semi-pure wafer having a vacancy rich region [V] at the center thereof and a perfect region [P] between the vacancy rich region and the edge, is formed. Preferably, the pure region [P] is at least 36% of the wafer area and more preferably is at least 60% of the wafer area.

In order to form wafers of FIG. 3C, V/G must be maintained greater than $(V/G)_1$, at point a and less than or equal to $(V/G)_2$ at the center C. In order to maintain the ratio of V/G between these two critical values, two thermal considerations are taken into account. First, the radial temperature gradient G experienced from the center C of the wafer to the diffusion length a of the wafer must be maintained within these values. Thus, V/G at the center should be close to $(V/G)_2$ in order to confine vacancy agglomerates to the vacancy rich region. Moreover, V/G at the diffusion length $L_f$ from the edge must be maintained greater than $(V/G)_1$ in order to prevent interstitial agglomerates. Accordingly, the hot zone of the furnace should preferably be designed to maintain a variation in G from the center of the wafer to the diffusion length of the wafer, such that V/G is maintained between $(V/G)_2$ and $(V/G)_1$.

A second consideration is that G will vary axially as the wafer is pulled from the melt beginning at the seed and ending at the tail. In particular, the increasing thermal mass of the ingot, the decreasing thermal mass of the melt and other thermal considerations will generally cause G to decrease as the ingot is pulled from the melt. Thus, in order to maintain V/G within the first and second critical ratios, the pull rate profile is adjusted as the ingot is pulled from the silicon melt in the hot zone furnace.

Figure 3D:
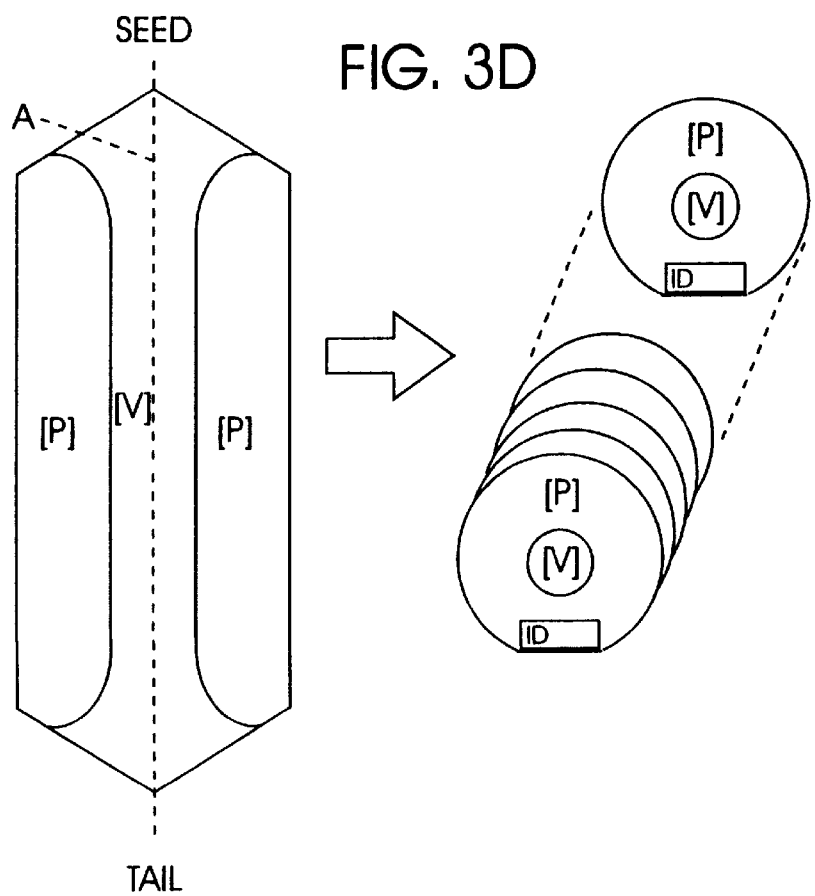

By controlling V/G as the ingot is pulled, vacancy agglomerates can be confined to a vacancy rich region [V] near the axis A of the ingot shown in FIG. 3D. Interstitial agglomerates are not formed, so that the area of the ingot outside the vacancy rich region [V] is labeled [P] for pure or perfect. As also shown in FIG. 3D, this yields a plurality of semi-pure wafers having vacancy rich regions [V] at the center thereof that include vacancy agglomerates, and pure regions between the vacancy rich region and a wafer edge that is free of vacancy agglomerates and interstitial agglomerates. The diameter of the vacancy rich region [V] is the same in each wafer. The identification of the plurality of wafers that are formed from a single ingot may be found by the ID number, labeled ID in FIG. 3D, which is generally an alphanumeric code that is marked on every wafer. This eighteen character field can identify the wafers as all coming from a single ingot.

Figure 3E:
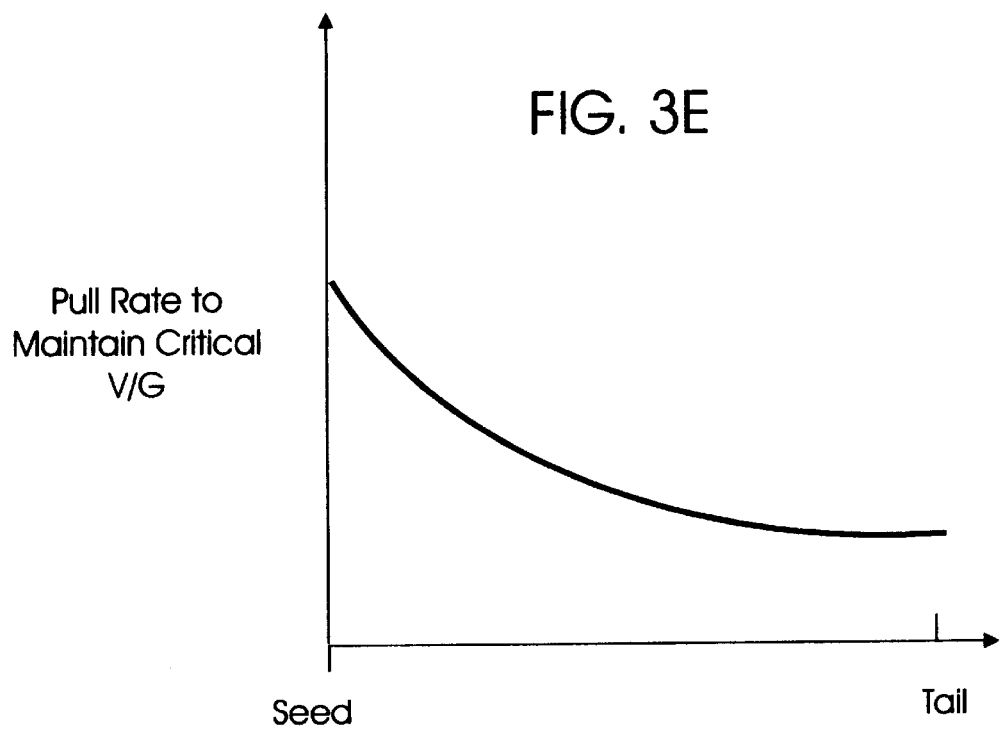

FIG. 3E illustrates a pull rate profile that is used to maintain V/G between the two critical ratios, as the ingot is pulled from the melt. Since G generally decreases as the ingot is pulled from the melt, the pull rate V is also generally decreased to maintain V/G between the two critical ratios. In order to allow for expected process variations, V/G is preferably maintained midway between the first and second critical ratios. Thus, a guard band is preferably maintained to allow for process variations.

Figure 4A:
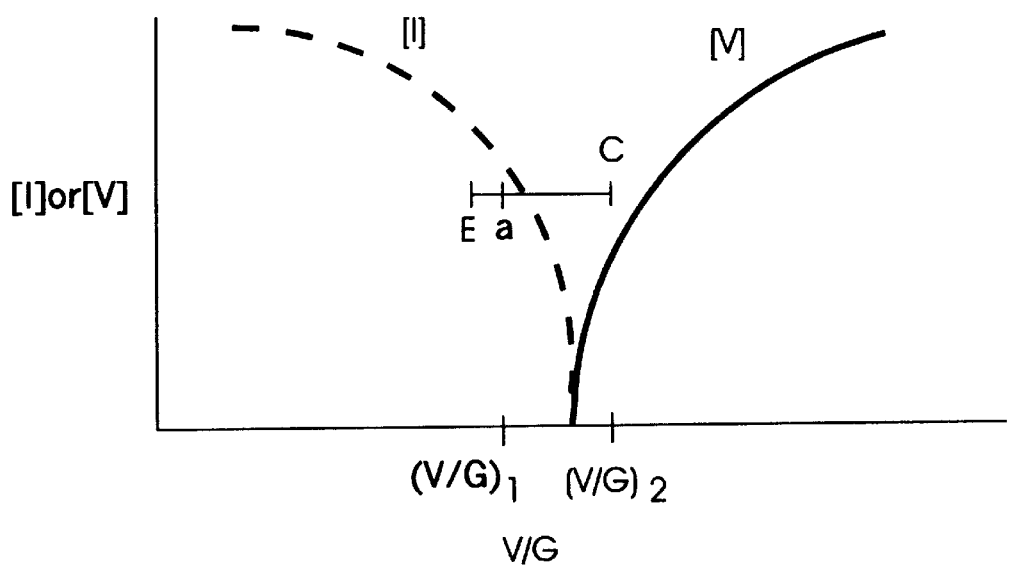
FIGS. 4A–4E illustrate an overview of the fabrication of wafers that are free of agglomerates.
Figure 4B:
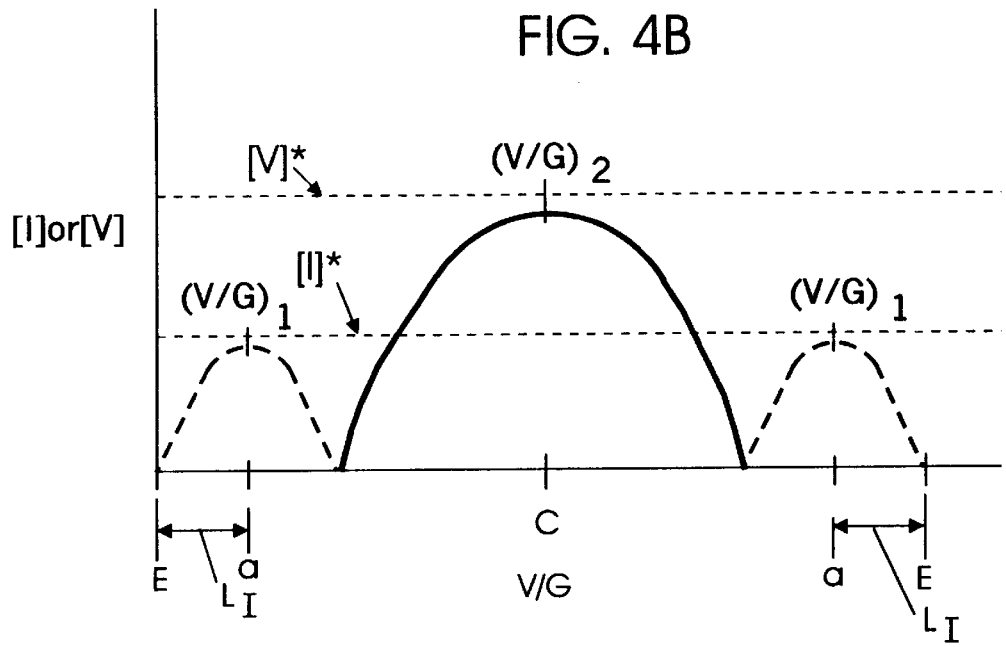
Figure 4C:
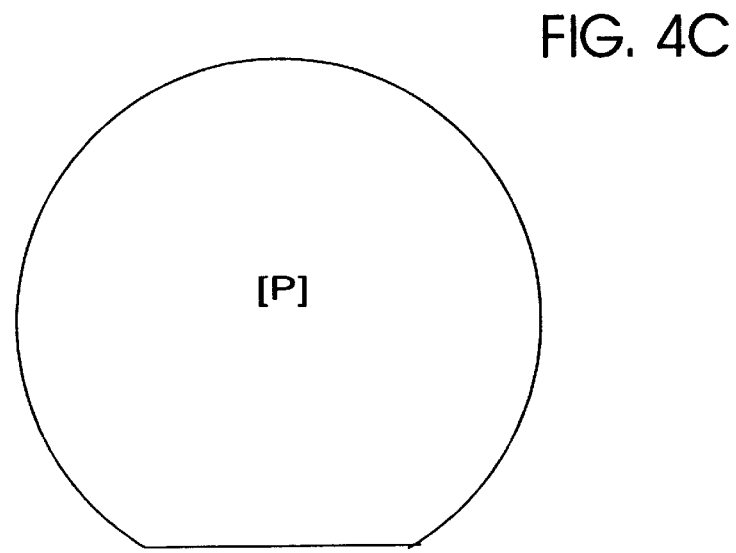
Figure 4D:
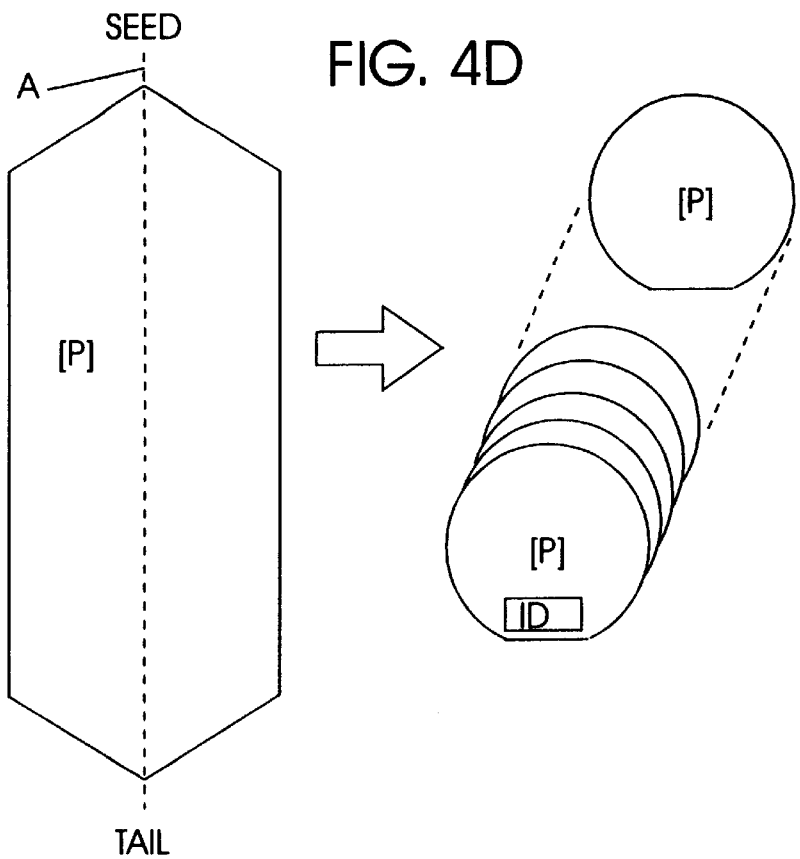
Figure 4E:
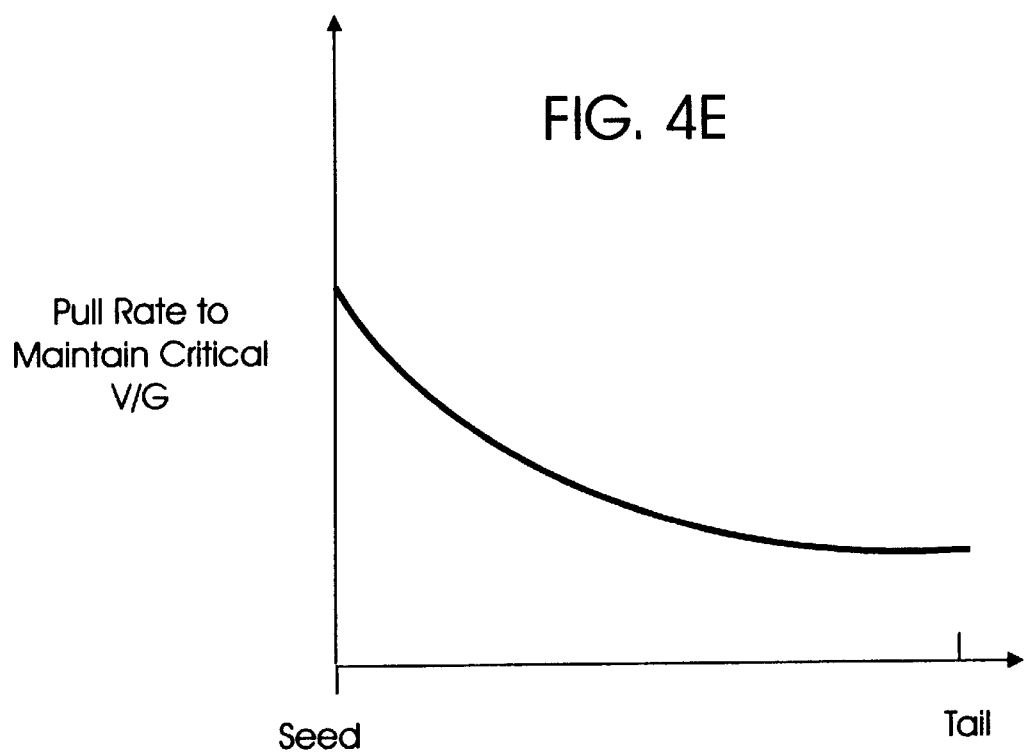

FIGS. 4A–4E correspond to FIG. 3A–3E and illustrate the control of a pull rate profile to form pure silicon ingots and wafers according to application Ser. No. 08/989,591. As shown in FIG. 4A, if V/G is maintained within a tighter tolerance between the wafer center C and a diffusion length a from the wafer edge E, the formation of vacancy agglomerates as well as interstitial agglomerates may be prevented throughout the wafer. Thus, as shown in FIG. 4B, in the center of the wafer (the axis A of the ingot), the ratio of V/G is maintained lower than the critical ratio $(V/G)_2$ which would form vacancy agglomerates. Similarly, V/G is maintained above the critical ratio $(V/G)_1$ that would form interstitial agglomerates. Accordingly, pure silicon [P] of FIG. 4C is formed that is free of interstitial agglomerates and vacancy agglomerates. The pure ingot is shown in FIG. 4D, along with a set of pure wafers. A pull rate profile for pure silicon is shown in FIG. 4E.

Overview: Modified Czochralski Pullers

Figure 5:
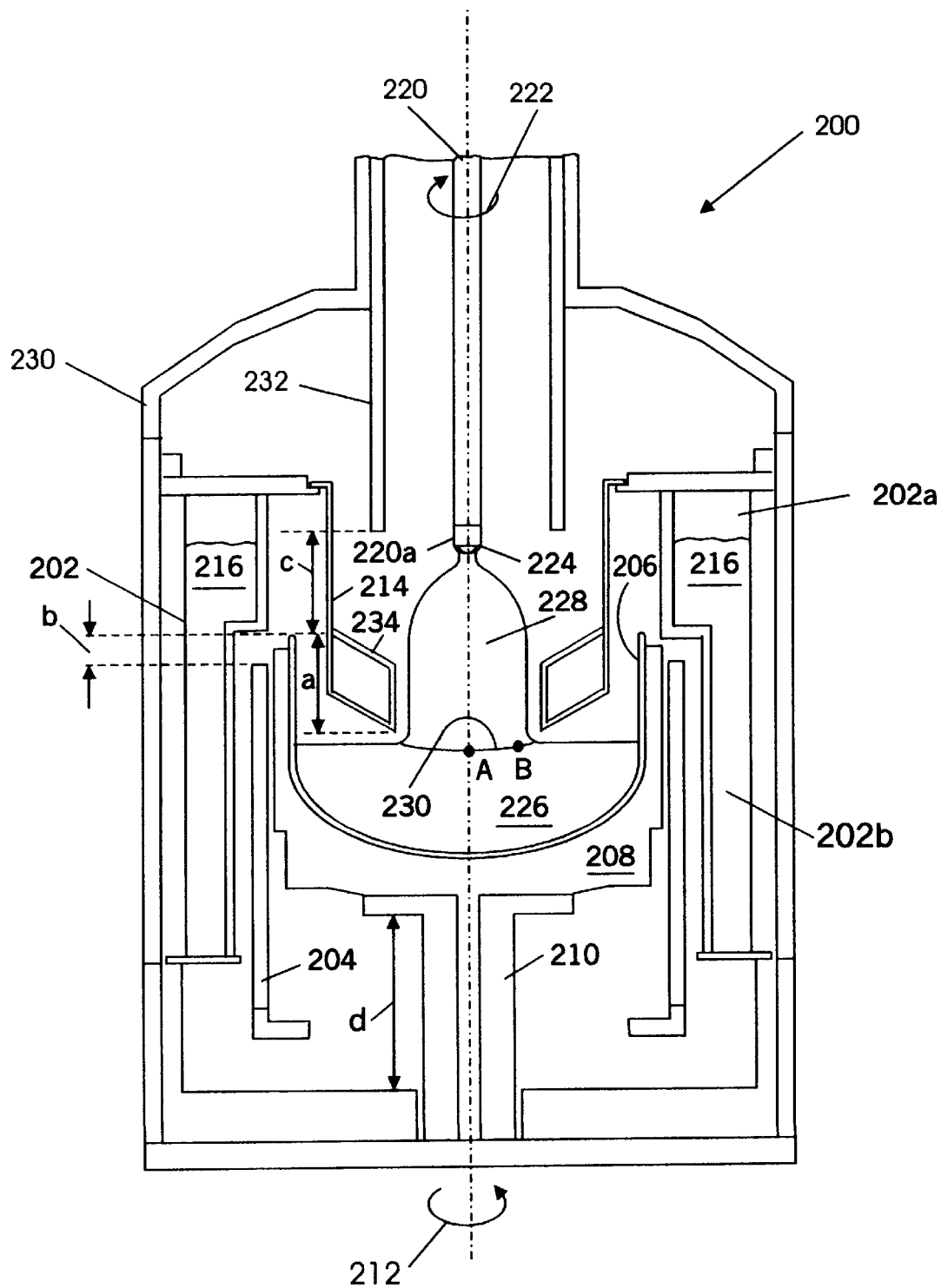
FIG. 5 illustrates modified Czochralski pullers and modification methods according to the present invention.

Referring now to FIG. 5, modified Czochralski pullers according to the present invention will now be described. As shown in FIG. 5, a modified Czochralski puller 200 includes a furnace, a crystal pulling mechanism, an environment controller and a computer-based control system. The Czochralski furnace is generally referred to as a hot zone furnace. A hot zone furnace includes a heater 204, a crucible 206 which may be made of quartz, a susceptor 208 which may be made of graphite and a rotation shaft 210 that rotates about an axis in a first direction 212 as shown.

A cooling jacket or port 232 is cooled by external cooling means such as water cooling. A heat shield 214 may provide additional thermal distribution. A heat pack 202 includes heat absorbing material 216 therein to provide additional thermal distribution.

The crystal pulling mechanism includes a crystal pulling shaft 220 which may rotate about the axis in a direction 222 opposite the direction 212 as shown. The crystal pulling shaft 220 includes a seed holder 220a at the end thereof. The seed holder 220a holds a seed crystal 224 which is pulled from the melt 226 in the crucible 206 to form an ingot 228.

The ambient control system may include the chamber enclosure 230, the cooling jacket 232 and other flow controllers and vacuum exhaust systems that are not shown. A computer-based control system may be used to control the heating element, the puller and other electrical and mechanical elements.

In order to grow a monocrystalline silicon ingot, the seed crystal 224 is contacted to the silicon melt 226 and is gradually pulled in the axial direction (up) by crystal pulling shaft 220 or other conventional means for pulling the seed holder away from the crucible. Cooling and solidification of the melt 226 into monocrystalline silicon occurs at the interface 220 between the ingot 220a and the melt 226.

According to the invention, at least one of the position of the heat shield 214, the configuration of the heat shield 214, the position of the heater 204, the configuration of the cooling jacket 202, the position of the crucible 206, the configuration of the heat pack 202 and the power that is applied to the heater 204 are selected to produce a temperature gradient at the ingot-melt interface that is greater than about 2.5 degrees Kelvin per millimeter at the axis, denoted by point A, and that is also at least about equal to the temperature gradient at a diffusion length from the cylindrical edge, denoted by point B. Stated differently, these parameters may be controlled so as to produce an ingot-melt interface 230 that is planar or is convex relative to the silicon melt 226, as illustrated in FIG. 5.

A theoretical discussion of the desirability of producing a temperature gradient at the ingot-melt interface that is greater than about 2.5 degrees Kelvin per millimeter at the axis and that is also at least about equal to the temperature gradient at a diffusion length from the cylindrical edge of the ingot, will first be described. Then, consideration of each of the parameters that can be varied will be described. Finally, variation of the parameters in combination will be described.

Theoretical Discussion

Recapitulating the discussion of the fabrication of perfect silicon, and referring again to FIG. 4B, it has been shown that to obtain perfect silicon the radial (r) and the axial (z) temperature gradients at the ingot-melt interface should be kept between the range of [V]* and [I]* from the axis of the ingot to a diffusion length from the cylindrical edge of the ingot corresponding to points C and a distance $L_f$ from point E of FIG. 4B. Thus:

$$(V/G)_1 < V/G(r) < (V/G)_2 \quad (1)$$

and $$(V/G)_1 < V/G(z) < (V/G)_2. \quad (2)$$

Defining $$\Delta V/G = (V/G)_2 - (V/G)_1 \quad (3)$$

to be the difference in V/G between the axis and a diffusion length from the cylindrical edge, the following result is obtained:

$$\Delta V/G = V\left(\frac{1}{G_2} - \frac{1}{G_1}\right) = V\left(\frac{G_1 - G_2}{G_1 \cdot G_2}\right). \quad (4)$$

Define $$\Delta G' = G_1 - G_2. \quad (5)$$

Then, in order to minimize $\Delta V/G$ in Equation (4), the following relationships should be maintained:

$$\Delta G' \leq 0 \quad (6)$$

and $$G_2 \geq 2.5. \quad (7)$$

Combining Equations (5) and (6) produces:

$$G_2 \geq G_1 \quad (8)$$

Stated in words, Equation (8) states that the temperature gradient at the ingot-melt interface at the axis (center) should be at least about equal to the temperature gradient at the ingot-melt interface at a diffusion length from the cylindrical edge. Stated in words, Equation (7) states that the temperature gradient at the ingot-melt interface should be greater than about 2.5 degrees Kelvin per millimeter at the axis (center).

Equation (7) is obtained based on experimental observations because a practical lower limit on the pull rate V is about 0.4 millimeters per minute. At pull rates below this rate the ingot may drop from the seed holder. Moreover, a practical lower limit on $(V/G)_2$ is 0.16 millimeters per degree Kelvin. (Dr. Park: Why is this the case?) Accordingly, the temperature gradient at the axis should be greater than about 2.5 degrees Kelvin per millimeter.

It has been found, according to the present invention, that when the temperature gradient at the ingot-melt interface is greater than about 2.5 degrees Kelvin per millimeter at the axis (corresponding to point A in FIG. 5) and is also at least about equal to the temperature gradient at a diffusion length from the cylindrical edge (corresponding to point B in FIG. 5), the ingot-melt interface 230 of FIG. 5 will be planar or convex relative to the silicon melt 226, as illustrated in FIG. 5.

Qualitatively, it has been found that perfect silicon may be produced by increasing heating at the ingot edge compared to the ingot center, to more than compensate for edge cooling effects. Moreover, a certain minimum temperature gradient at the center should also be maintained. When these two criteria are both satisfied, perfect silicon may be produced.

From a heat transfer perspective, it has been found according to the invention that more heat should be transferred from the melt 226 to the air 236 in the crucible 206 than from the melt 226 to the ingot 228. In other words, more heat should be transferred across the liquid/air interface compared to the liquid/solid interface. In order to accomplish this preferred transfer, additional heat from the heater 204 should reach the edge of the ingot 228 via the air 236.

Figure 6:
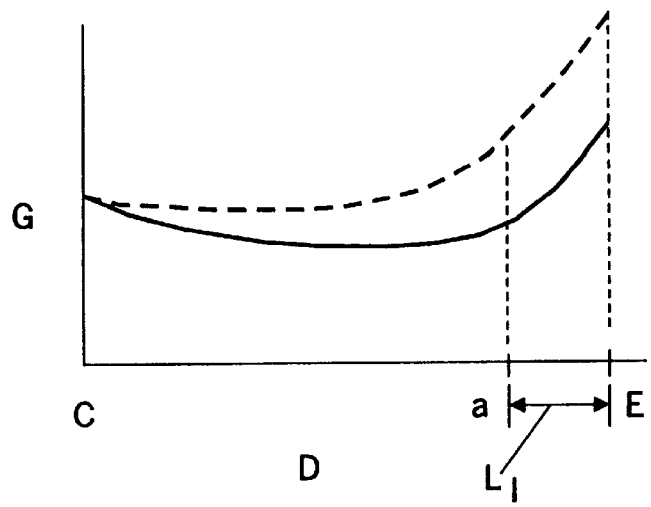
FIG. 6 graphically illustrates a comparison between conventional radial temperature gradients as a function of distance and radial temperature gradients as a function of distance according to the present invention.

FIG. 6 illustrates radial gradient G as a function of distance D from the center (axis) C to the edge E of the ingot. As shown by the solid line, according to the invention, the gradient at the ingot-melt interface at the center C is at least about equal to the gradient at a diffusion length $L_f$ from the cylindrical edge E. This contrasts with a conventional temperature gradient, shown as a dotted line in FIG. 6, that generally is much greater at a diffusion length from the edge E than at the center C of the ingot.

Parameter Variation

As described above, according to the invention, at least one of the position of the heat shield 214, the configuration of the heat shield 214, the position of the heater 204, the position of the cooling jacket 232, the position of the crucible 206, the configuration of the heat pack 202 and the power that is applied to the heater 204 are selected to produce a temperature gradient at the ingot-melt interface that is greater than about 2.5 degrees Kelvin per millimeter at the ingot axis and that is also at least about equal to the temperature gradient at a diffusion length from the cylindrical edge of the ingot. In the following description, the temperature gradient at the ingot axis, heretofore defined as $G_2$, will now be referred to as $G_{center}$. the selection of each of these parameters will now be described. It will understood by those having skill in the art that the actual value of each parameter may depend upon a particular manufacturer and model of Czochralski puller that is being modified. Moreover, for a given Czochralski puller, multiple sets of parameters may yield the results described above.

Figure 7:
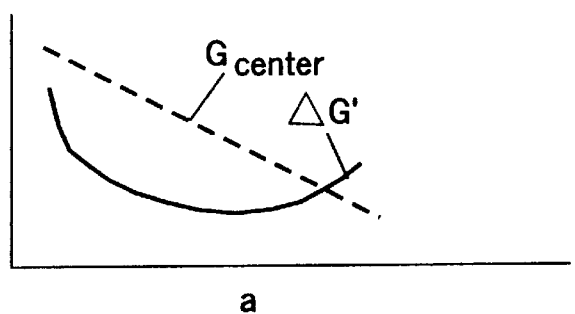
FIG. 7 graphically illustrates observed trends in variations of temperature gradients as a function of the distance between the heat shield bottom and the crucible top according to the present invention.

Selection of the position of the heat shield 214 will now be described. As shown in FIG. 5, the crucible 206 includes a crucible top and a crucible bottom and the heat shield 214 includes a heat shield top and a heat shield bottom. The position of the heat shield is selected by varying the distance between the heat shield bottom and the crucible top. This distance is denoted by a in FIG. 5. FIG. 7 graphically illustrates the observed trends in variations of $\Delta G'$ and $G_{center}$ as a function of distance a. As shown, there may be a nonlinear relationship between these two quantities.

Modification of the configuration of the heat shield 214 will now be described. As shown in FIG. 5 a conventional heat shield is modified by adding a heat shield cover 234 at the heat shield bottom. The heat shield cover 234 is preferably filled with a heat conservation material such as carbon ferrite. The physical dimensions of the heat shield cover may also be varied as will be described in detail below.

Figure 8:
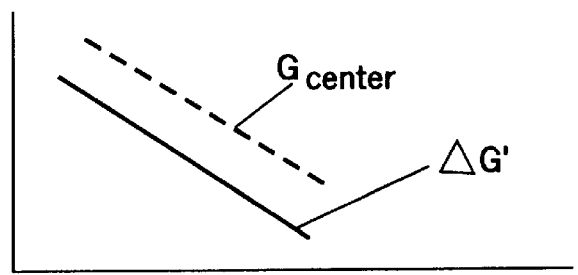
FIG. 8 graphically illustrates observed trends in variations of temperature gradients as a function of the distance between the crucible top and the heater top according to the present invention.

Modification of the position of the heater 204 will now be described. As shown in FIG. 5, the heater 204 includes a heater top and a heater bottom. The position of the heater is varied by varying the distance between the crucible top and the heater top. This distance is shown as b in FIG. 5. Observed trends in variations of $G_{center}$ and ΔG' as a function of distance b is shown in FIG. 8.

Figure 9:
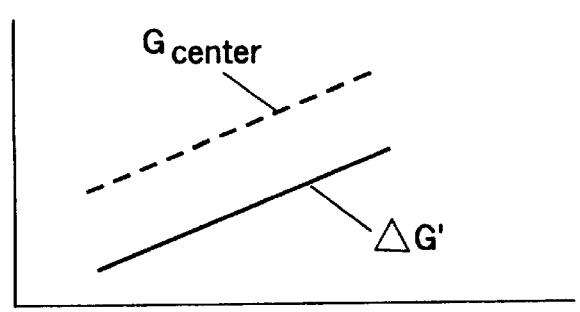
FIG. 9 graphically illustrates observed trends in variations of temperature gradients as a function of the distance between crucible and the enclosure according to the present invention.

According to the invention, the position of the heater 204 and the position of the crucible 206 may also be concurrently varied axially relative to the enclosure 230. In particular, after varying the distance b between the crucible top and the heater top, the distance d between the crucible 206 and the enclosure 230 may be varied. FIG. 9 graphically illustrates observed trends in variations of ΔG' and $G_{center}$ as a function of the distance d while maintaining the distance b constant.

Figure 10:
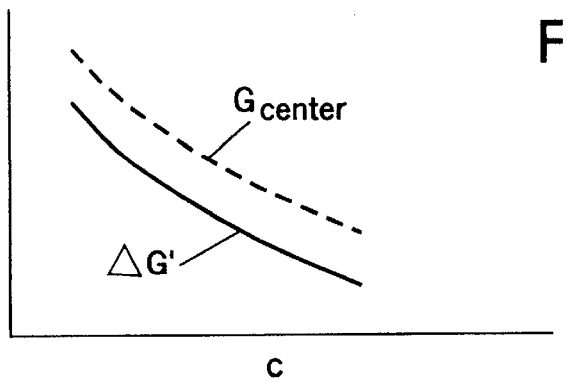
FIG. 10 graphically illustrates observed trends in variations of temperature gradients as a function of the distance between the crucible top and the cooling jacket bottom according to the present invention.

Modification of the cooling jacket position will now be described. As shown in FIG. 5, the cooling jacket 232 includes a cooling jacket top and a cooling jacket bottom. According to the invention, the position of the cooling jacket is varied by varying the distance between the crucible top and the cooling jacket bottom. This distance is denoted by c in FIG. 5. FIG. 10 graphically illustrates observed trends in variations of $G_{center}$ and ΔG' as a function of distance c.

Figure 11:
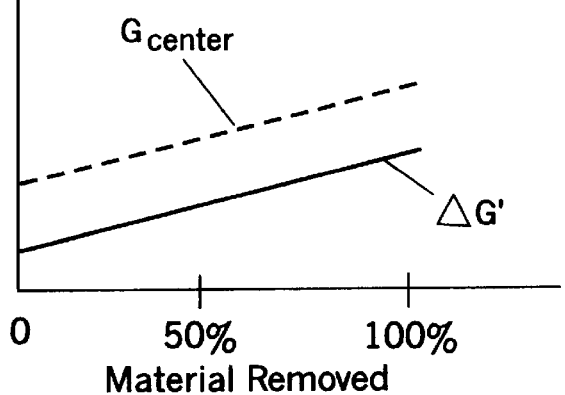
FIG. 11 graphically illustrates observed trends in variations of temperature gradients as a function of the amount of heat absorbing material that is removed from the upper heat pack housing according to the present invention.

Modification of the heat pack material 216 may also be provided according to the present invention. More specifically, as shown in FIG. 5, the heat pack housing 202 includes an upper heat pack housing 202a and a lower heat pack housing 202b. Heat absorbing material 216, generally carbon ferrite, may be removed from the upper heat pack housing 202a. In one embodiment, heat absorbing material is removed from the entire upper heat pack housing 202a. FIG. 11 graphically illustrates observed trends in variations of ΔG', $G_{center}$ and the amount of heat absorbing material 216 that is removed from the upper heat pack housing 202a.

Variation of Parameters in Combination

As described above, each of the parameters of the Czochralski puller may individually nonlinearly vary $G_{center}$ and ΔG'. Accordingly, trial and error and/or simulations may be used to vary all of the parameters to obtain ΔG'≦0 and $G_{center}$≧2.5.

Figure 12:
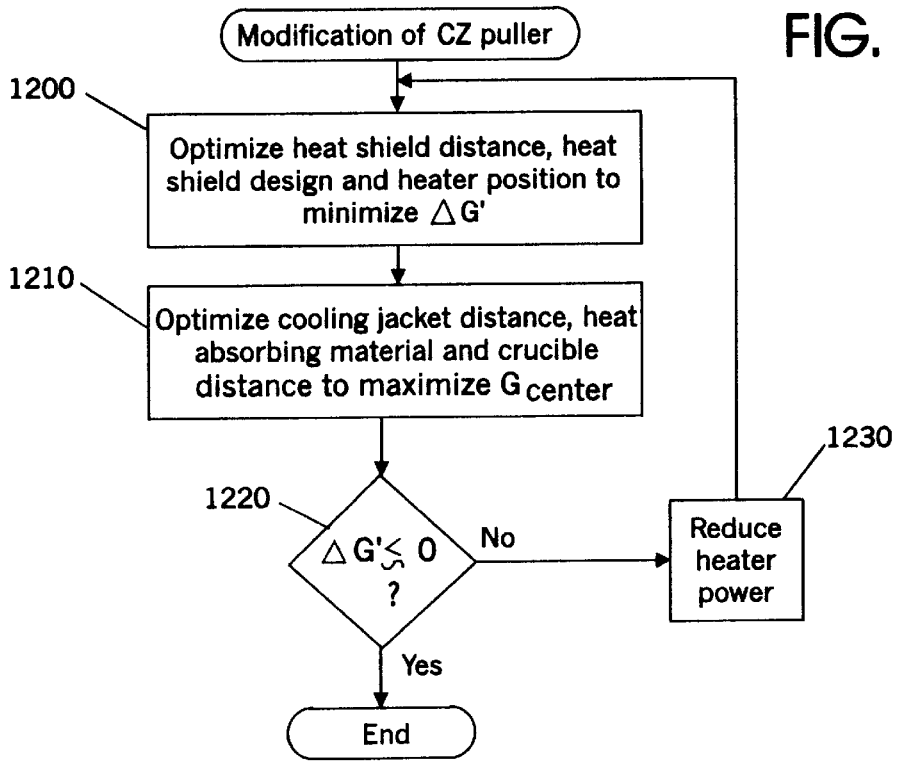
FIG. 12 is a flowchart illustrating steps for varying parameters in combination according to the present invention.

It has been found, according to the invention, that the following steps may be performed to modify a Czochralski puller. Referring to FIG. 12, at Block 1200, at least one of the heat shield position a, the heat shield design and the heater position b are selected to produce a temperature gradient at the ingot-melt interface at the axis that is at least about equal to the temperature gradient at a diffusion length from the cylindrical edge. More preferably, the position a of the heat shield 214, the configuration of the heat shield 214 and the position b of the heater are all selected to minimize ΔG'. Unfortunately, during this process, the temperature gradient at the axis $G_{center}$ also may decrease.

Then, at Block 1210, at least one of the position c of the cooling jacket 232, the amount of heat absorbing material 216 in the heat pack 202 and the position d of the crucible 206 are modified to produce a temperature gradient at the ingot-melt interface at the axis that is greater than about 2.5 degrees Kelvin per millimeter. More preferably, the cooling jacket distance c, the amount of heat absorbing material and the crucible distance d are all modified to maximize $G_{center}$.

Unfortunately, the maximizing of $G_{center}$ at Block 1210 may cause ΔG' to increase. Accordingly, at Block 1220, the test is made as to whether ΔG' is still less than or about equal to zero. If yes, then the Czochralski puller is optimized. If not, then at Block 1230 the heater power is reduced and the operations of Blocks 1200 and 1210 are again performed until ΔG' is less than about zero.

Design of Heat Shield

It has been found that the design of the heat shield 214 of FIG. 5 can have a profound influence on the performance of the Czochralski puller. Accordingly, the detailed design of the heat shield 214 will now be described.

Figure 13:
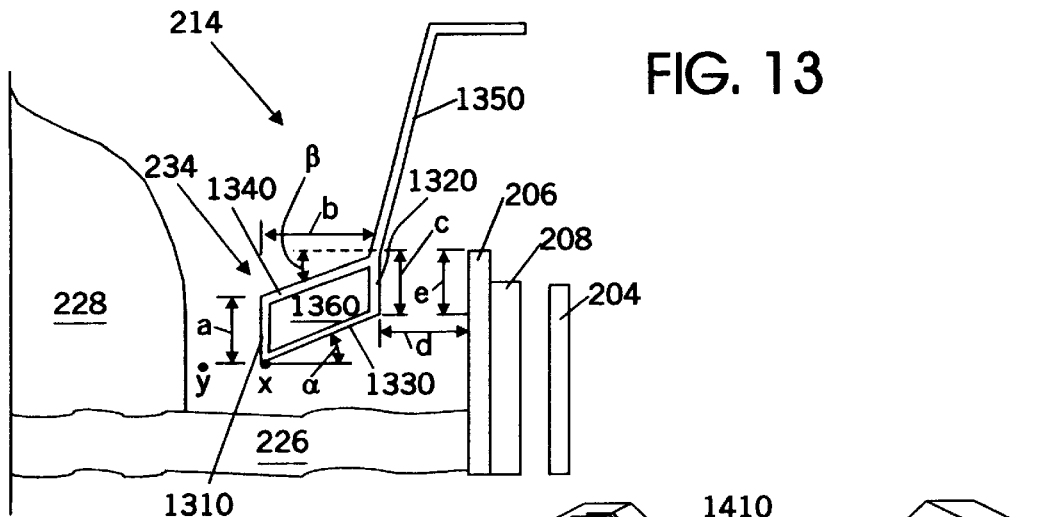
FIG. 13 is an enlarged view of a heat shield of FIG. 5.

FIG. 13 is an enlarged view of the heat shield 214 of FIG. 5 and the elements that surround the heat shield 214. As shown in FIG. 13, the heat shield 214 preferably includes a ringed-shaped heat shield cover or housing 234 within the crucible 206. The ring-shaped heat shield housing 234 may comprise carbon coated silicon carbide and preferably comprises an inner heat shield housing wall 1310, an outer heat shield housing wall 1320, an oblique heat shield housing floor 1330 and a heat shield housing roof 1340 that is also preferably oblique. The heat shield housing contains insulating material 1360 such as carbon ferrite therein. A support member 1350 supports the ring-shaped heat shield housing 234 within the crucible 206. The support member 1350 also may comprise carbon coated silicon carbide.

As shown in FIG. 13, the inner and outer heat shield walls 1310 and 1320 respectively, are preferably vertical inner and outer heat shield walls. The heat shield housing floor 1330 and the heat shield housing roof 1340 are preferably oblique, making angles α and β respectively with the horizontal.

It has been found according to the invention that many of the physical parameters of the ring-shaped heat shield housing 234 may be varied to change the temperature gradient at the center of the ingot 228 compared to at the edge of the ingot 228. Among the variables that can be changed are the angle α of the floor 1330, angle β of the roof 1340, the length a of the inner wall 1310, the distance b between the inner wall 1310 and the outer wall 1320, the length c of the outer wall 1320, the distance d between the crucible 206 and the inner wall 1320, and the distance e between the crucible top and the oblique floor 1330.

In general, the ring-shaped heat shield housing 234 includes insulating material 1360 therein. The insulating material 1360 insulates heat from the heater 204 relative to the ingot 228. The insulating material 1360 also conserves heat that is radiated from the ingot 228.

In particular, when increasing α and maintaining all other variables equal, the temperature at point x, at the intersection of the ring-shaped heat shield housing inner wall 1310 and floor 1330, may increase. The temperature at point y adjacent the ingot 228 also may increase due to increased heat conservation from the ingot 228. Moreover, if length a is increased relative to length c, more heat conservation from the ingot may take place so that the temperature at point x may increase and the temperature at point b may increase, but the temperature gradient at the center of the ingot 228 may decrease. In contrast, if β is increased, then the temperature gradient at the center of the ingot may increase.

The position of the heat shield housing 234 relative to the crucible 206, denoted by d in FIG. 13 also may impact the performance of the Czochralski puller. In particular, as d increases there may be more heat conservation caused by heat radiation from the ingot so that the temperature at point x and point y may increase. Moreover, the difference in temperature gradient between the center and edge of the ingot 228 may decrease and the temperature at the center of the ingot also may decrease. Finally, the axial distance between the heat shield housing 234 and the crucible 206, shown as e in FIG. 13, also may be varied. Specifically, as the heat shield housing 234 is moved upwardly relative to the crucible 206, thereby decreasing distance e, the temperature gradient at the center of the ingot may increase and the difference between the temperature gradient between the center of the ingot and the edge of the ingot also may increase.

Accordingly, all of these parameters may be varied in order to produce a temperature gradient at the ingot-melt interface that is greater than about 2.5 degrees Kelvin per millimeter at the axis and that is also at least about equal to the temperature gradient at a diffusion length from the cylindrical edge of the ingot.

Figure 14A:
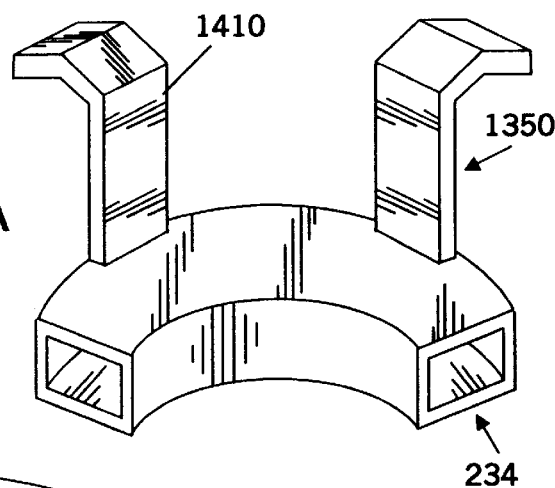
FIGS. 14A–14D are cutaway perspective views of embodiments of heat shields according to the present invention.
Figure 14B:
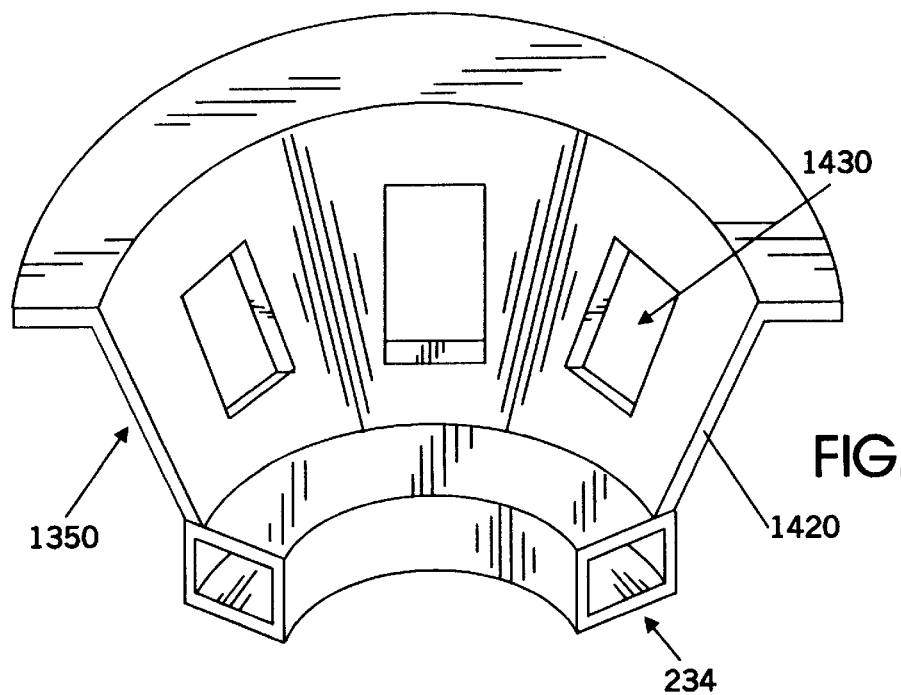

FIGS. 14A–14D also illustrate various configurations of the support member 1350 that can also impact the thermal characteristics of the Czochralski puller. FIGS. 14A–14D are partial perspective views of a heat shield 214. As shown in FIG. 14A, the support member 1350 may include one or more supporting arms 1410. Alternatively, as shown in FIG. 14B, the support member 1350 may be a ring-shaped support member 1420. The ring-shaped support member 1420 may include one or more windows 1430 therein. The windows 1430 may be openings or may be quartz windows. The ring-shaped support member may be oblique as shown.

Figure 14C:
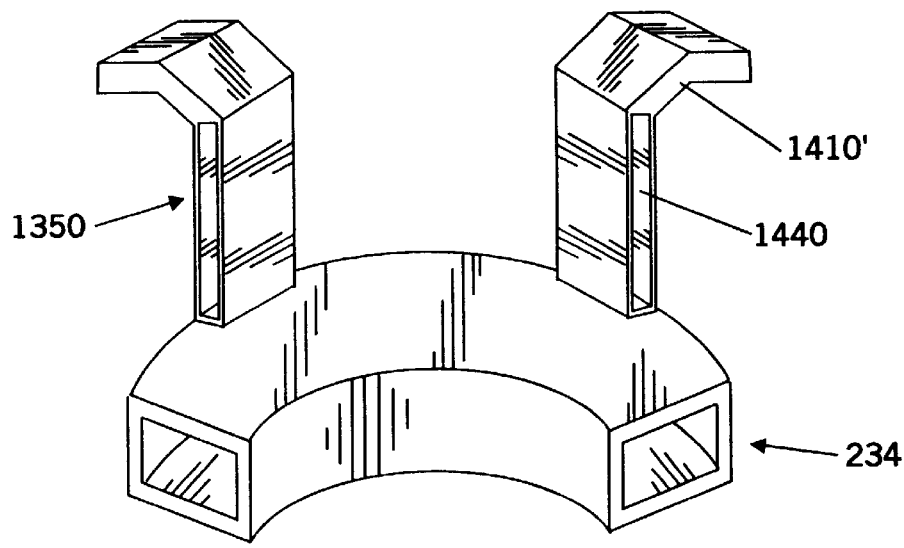
Figure 14D:
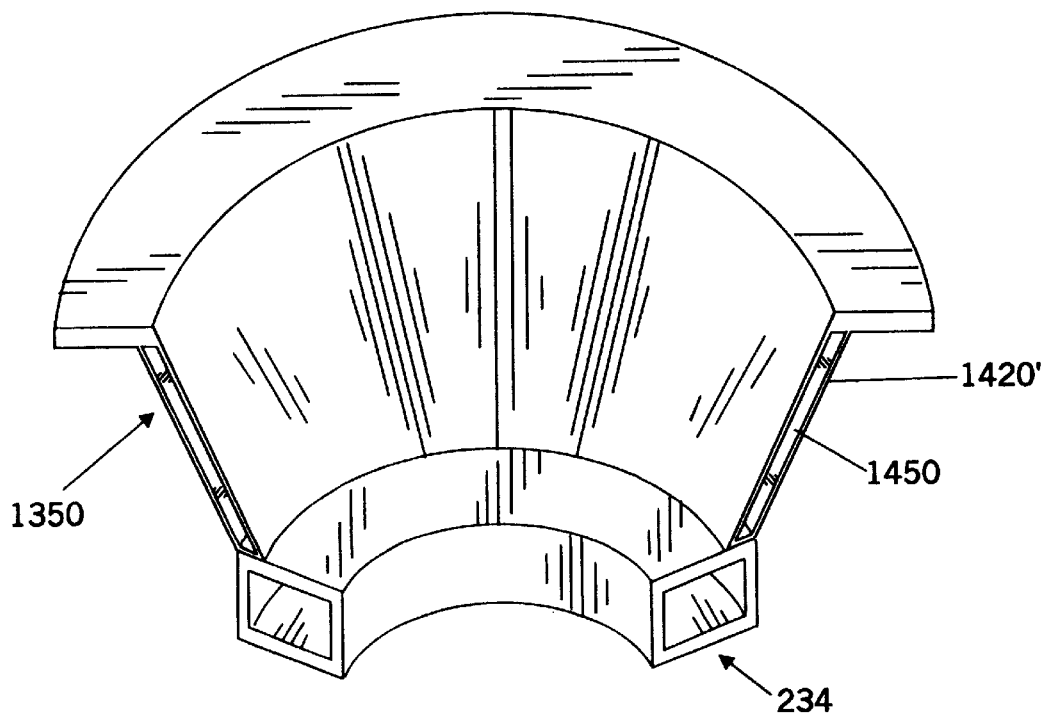

As shown in FIG. 14C, the support arms 1410 may be hollow support arms 1410' that contain insulating material 1440 therein. Similarly, as shown in FIG. 14D, the ring-shaped support member 1420 may be a hollow ring-shaped support member 1420' containing insulating material 1450 therein. It will also be understood that the support member need not be attached to the ring-shaped heat shield housing 234 at the outer wall thereof as illustrated. Rather, the attachment position may be varied between the outer and inner walls thereof.

It has been found that the addition of insulating material in the supporting member 1410 or 1420 to produce hollow supporting members 1410' and 1420' respectively may insulate the heater 204 from the ingot 228 and may also provide faster heat transfer from the ingot surface. Thus, temperature gradients at the center of the ingot may increase and the difference between temperature gradients at the ingot center compared to the ingot edge also may decrease.

When modifying the Czochralski puller to provide a temperature gradient at the ingot-melt interface that is greater than about 2.5 degrees Kelvin per millimeter at the axis and that is also at least about equal to the temperature gradient at a diffusion length from the cylindrical edge, it has been found that adjusting $\alpha$, a and c may dominate to produce a temperature gradient at the ingot-melt interface that is greater at the axis than at a diffusion length from the cylindrical edge. Moreover, adjusting $\beta$ and providing insulating material in the support arm may dominate the temperature gradient at the axis. Accordingly, in designing the heat shield 214, $\beta$, a and c may be increased to reduce $\Delta G'$. Then, $\beta$ may be increased and insulation material may be added to obtain sufficiently high $G_{center}$. One design of the ring-shaped heat shield housing includes an outer wall 1320 of length c 125 mm, an inner wall 1310 of length a 55 mm, a distance d of 7.4 mm and an angle $\alpha$ of 5 degrees.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A Czochralski puller for growing monocrystalline silicon ingots comprising:

an enclosure;

a crucible in the enclosure that holds a silicon melt;

a seed holder in the enclosure, adjacent the crucible;

a heater in the enclosure, surrounding the crucible;

a heat pack in the enclosure, surrounding the heater;

a heat shield between the crucible and the seed holder;

a cooling jacket between the heat shield and the seed holder; and means for pulling the seed holder away from the crucible to thereby pull a monocrystalline silicon ingot from the silicon melt, the monocrystalline silicon ingot having an axis and a cylindrical edge, the silicon melt and the ingot defining an ingot-melt interface therebetween;

at least one of the position of the heat shield, the configuration of the heat shield, the position of the heater, the configuration of the cooling jacket, the position of the crucible, the configuration of the heat pack and the power that is applied to the heater being selected to produce a temperature gradient at the ingot-melt interface that is greater than about 2.5 degrees Kelvin per millimeter at the axis and that is also at least about equal to the temperature gradient at a diffusion length from the cylindrical edge.

2. A Czochralski puller according to claim 1 wherein the crucible includes a crucible top and a crucible bottom, wherein the heat shield includes a heat shield top and a heat shield bottom and wherein the position of the heat shield is selected by varying the distance between the heat shield bottom and the crucible top.

3. A Czochralski puller according to claim 1 wherein the heat shield includes a heat shield top and a heat shield bottom and wherein the configuration of the heat shield is selected by providing a heat shield cover at the heat shield bottom.

4. A Czochralski puller according to claim 3 wherein the heat shield cover comprises a ring-shaped heat shield housing within the crucible, including inner and outer heat shield housing walls and an oblique heat shield housing floor and a heat shield housing roof that extend between the inner and outer heat shield housing walls, the heat shield housing containing insulating material therein.

5. A Czochralski puller according to claim 4 wherein the oblique heat shield housing defines an angle from horizontal and wherein the configuration of the heat shield is selected by varying the angle.

6. A Czochralski puller according to claim 1 wherein the crucible includes a crucible top and a crucible bottom, wherein the heater includes a heater top and a heater bottom and wherein the position of the heater is selected by varying the distance between the crucible top and the heater top.

7. A Czochralski puller according to claim 6 wherein the position of the heater and the position of the crucible also are concurrently varied axially relative to the enclosure.

8. A Czochralski puller according to claim 1 wherein the crucible includes a crucible top and a crucible bottom, wherein the cooling jacket includes a cooling jacket top and a cooling jacket bottom and wherein the position of the cooling jacket is selected by varying the distance between the crucible top and the cooling jacket bottom.

9. A Czochralski puller according to claim 1 wherein the heat pack includes an upper heat pack housing and a lower heat pack housing, each of which is filled with heat absorbing material and wherein the configuration of the heat pack is selected by removing at least some of the heat absorbing material from the upper heat pack housing.

10. A Czochralski puller according to claim 1 wherein at least one of the position of the heat shield, the configuration of the heat shield and the position of the heater are selected to produce a temperature gradient at the ingot-melt interface at the axis that is at least about equal to the temperature gradient at a diffusion length from the cylindrical edge, and wherein at least one of the configuration of the cooling jacket, the position of the crucible and the configuration of the heat pack are selected to produce a temperature gradient at the ingot-melt interface at the axis that is greater than about 2.5 degrees Kelvin per millimeter.

11. A Czochralski puller according to claim 10 wherein the crucible includes a crucible top and a crucible bottom, wherein the heat shield includes a heat shield top and a heat shield bottom, wherein the heater includes a heater top and a heater bottom, wherein the position of the heat shield is selected by varying the distance between the heat shield bottom and the crucible top, wherein the configuration of the heat shield is selected by providing a heat shield cover at the heat shield bottom, wherein the position of the heater is selected by varying the distance between the crucible top and the heater top, and wherein the position of the heat shield, the configuration of the heat shield and the position of the heater are all selected to produce a temperature gradient at the ingot-melt interface at the axis that is greater than the temperature gradient at the cylindrical edge.

12. A Czochralski puller according to claim 11 wherein the crucible includes a crucible top and a crucible bottom, wherein the heater includes a heater top and a heater bottom, wherein the cooling jacket includes a cooling jacket top and a cooling jacket bottom, wherein the heat pack includes an upper heat pack housing and a lower heat pack housing, each of which is filled with heat absorbing material, wherein the position of the heater is selected by varying the distance between the crucible top and the heater top, wherein the position of the heater and the position of the crucible also are concurrently varied axially relative to the enclosure, wherein the position of the cooling jacket is selected by varying the distance between the crucible top and the cooling jacket bottom, wherein the configuration of the heat pack is selected by removing at least some of the heat absorbing material from the upper heat pack housing, and wherein the configuration of the cooling jacket, the position of the crucible, the position of both the heater and the crucible and the configuration of the heat pack are all selected to produce a temperature gradient at the ingot-melt interface at the axis that is greater than 2.5 about degrees Kelvin per millimeter.

13. A Czochralski puller for growing monocrystalline silicon ingots comprising:
    an enclosure;
    a crucible in the enclosure that holds a silicon melt;
    a seed holder in the enclosure, adjacent the crucible;
    a heater in the enclosure, surrounding the crucible;
    a heat pack in the enclosure, surrounding the heater;
    a heat shield between the crucible and the seed holder;
    a cooling jacket between the heat shield and the seed holder; and
    means for pulling the seed holder away from the crucible to thereby pull a monocrystalline silicon ingot from the silicon melt, the monocrystalline silicon ingot having an axis and a cylindrical edge, the silicon melt and the ingot defining an ingot-melt interface;
    at least one of the position of the heat shield, the configuration of the heat shield, the position of the heater, the configuration of the cooling jacket, the position of the crucible, the configuration of the heat pack and the power that is applied to the heater being selected to produce an ingot-melt interface that is planar or is convex relative to the silicon melt.

14. A Czochralski puller according to claim 13 wherein the crucible includes a crucible top and a crucible bottom, wherein the heat shield includes a heat shield top and a heat shield bottom and wherein the position of the heat shield is selected by varying the distance between the heat shield bottom and the crucible top.

15. A Czochralski puller according to claim 13 wherein the heat shield includes a heat shield top and a heat shield bottom and wherein the configuration of the heat shield is selected by providing a heat shield cover at the heat shield bottom.

16. A Czochralski puller according to claim 15 wherein the heat shield cover comprises a ring-shaped heat shield housing within the crucible, including inner and outer heat shield housing walls and an oblique heat shield housing floor and a heat shield housing roof that extend between the inner and outer heat shield housing walls, the heat shield housing containing insulating material therein.

17. A Czochralski puller according to claim 16 wherein the oblique heat shield housing defines an angle from horizontal and wherein the configuration of the heat shield is selected by varying the angle.

18. A Czochralski puller according to claim 13 wherein the crucible includes a crucible top and a crucible bottom wherein the heater includes a heater top and a heater bottom and wherein the position of the heater is selected by varying the distance between the crucible top and the heater top.

19. A Czochralski puller according to claim 18 wherein the position of the heater and the position of the crucible also are concurrently varied axially relative to the enclosure.

20. A Czochralski puller according to claim 13 wherein the crucible includes a crucible top and a crucible bottom, wherein the cooling jacket includes a cooling jacket top and a cooling jacket bottom and wherein the position of the cooling jacket is selected by varying the distance between the crucible top and the cooling jacket bottom.

21. A Czochralski puller according to claim 13 wherein the heat pack includes an upper heat pack housing and a lower heat pack housing, each of which is filled with heat absorbing material and wherein the configuration of the heat pack is selected by removing at least some of the heat absorbing material from the upper heat pack housing.

* * * * *